US000001145H

United States Statutory Invention Registration [19]

[11] Reg. Number: H1145

Anderson

[43] Published: Mar. 2, 1993

[54] RAPID TEMPERATURE RESPONSE WAFER CHUCK

[75] Inventor: Richard L. Anderson, Austin, Tex.

[73] Assignee: Sematech, Inc., Austin, Tex.

[21] Appl. No.: 790,098

[22] Filed: Nov. 6, 1991

Related U.S. Application Data

[63] Continuation of Ser. No. 587,718, Sep. 25, 1990, abandoned.

[51] Int. Cl.[5] ..... F25B 19/02; F25B 29/00

[52] U.S. Cl. ..... 165/61; 62/51.1; 62/52.1; 118/724; 118/725; 118/728; 165/64; 165/80.4; 165/104.33; 165/908; 165/911; 250/492.2

[58] Field of Search ..... 165/908, 104.33, 911, 165/61, 64, 80.4; 118/724, 725, 728; 250/492.2; 62/51.1, 52.1

[56] References Cited

U.S. PATENT DOCUMENTS

| | | | |
|---|---|---|---|
| 3,109,485 | 11/1963 | Fortier | 165/908 |
| 3,414,753 | 12/1968 | Hruda | 165/908 |
| 3,501,356 | 3/1970 | Chu | 148/175 |
| 3,669,812 | 6/1972 | Ensslin | 165/26 |
| 3,724,536 | 4/1973 | Baxter | 165/27 |
| 3,843,910 | 10/1974 | Ringuet | 165/908 |
| 3,885,061 | 5/1975 | Corboy et al. | 117/201 |
| 4,261,762 | 4/1981 | King | 148/1.5 |
| 4,274,476 | 6/1981 | Garrett | 165/80 |
| 4,282,924 | 8/1981 | Faretra | 165/80 |
| 4,353,392 | 10/1982 | Eastman | 165/104.33 |
| 4,457,359 | 7/1984 | Holden | 165/80 |
| 4,496,609 | 1/1985 | McNeilly et al. | 427/55 |
| 4,542,298 | 9/1985 | Holden | 250/443.1 |
| 4,549,407 | 10/1985 | Gruber | 165/911 |
| 4,603,466 | 5/1986 | Morley | 29/569 |
| 4,615,755 | 10/1986 | Tracy et al. | 156/345 |
| 4,628,991 | 12/1986 | Hsiao et al. | 165/80 |
| 4,635,709 | 1/1987 | Attoz | 165/104.33 |
| 4,671,204 | 6/1987 | Ballou | 118/59 |
| 4,680,061 | 7/1987 | Lamont | 148/1.5 |
| 4,705,951 | 11/1987 | Layman et al. | 250/442.1 |
| 4,724,621 | 2/1988 | Hobson et al. | 34/218 |
| 4,738,748 | 4/1988 | Kisa | 156/643 |
| 4,771,730 | 9/1988 | Tezuka | 118/723 |
| 4,810,342 | 3/1989 | Inoue | 204/192 |
| 4,838,041 | 6/1989 | Bellows et al. | 165/908 |
| 4,912,600 | 3/1990 | Jaeger et al. | 165/104.33 |
| 4,949,783 | 8/1990 | Lakios et al. | 165/80.1 |
| 4,969,511 | 11/1990 | Person | 165/80.4 |

FOREIGN PATENT DOCUMENTS

| | | | |
|---|---|---|---|
| 0136349 | 7/1985 | Japan | 165/104.33 |
| 1001239 | 2/1983 | U.S.S.R. | 165/908 |

*Primary Examiner*—David H. Brown
*Attorney, Agent, or Firm*—William W. Kidd

[57] ABSTRACT

A wafer chuck having a substantially hollow cavity therein utilizes the latent vaporization of a liquid to extract heat from the wafer. An insulated heater provides for heating the wafer to its desired operating point as rapidly as possible in order to bring the wafer to its operating point before plasma etching or deposition occurs.

12 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

RAPID TEMPERATURE RESPONSE WAFER CHUCK

This application is a continuation of application Ser. No. 587,718, filed on Sep. 25, 1990, now abandoned.

BACKGROUND OF THE INVENTION

1. Field of the Invention

The present invention relates to the field of semiconductor manufacturing devices and, more particularly, to chucks for controlling wafer temperature.

2. Prior Art

In the manufacture of semiconductor integrated circuit devices, various circuit elements are formed in or on a base substrate, such as a silicon substrate. Generally, the process of forming these various circuit elements starts from a base wafer, which is typically flat and is circular in shape. On each of these flat circular wafers, a number of integrated circuit devices, typically known as "chips" are formed by the use of various well-known techniques, including photolithography, doping, depositing, etching, and annealing techniques, just to name a few.

In performing some of these steps, a wafer is placed in a chamber in order for the wafer to undergo a necessary processing step, such as deposition or etching. When these wafers are loaded into a given chamber, the wafer is placed on a wafer chuck, which is a type of semiconductor platen. These platens, or chucks, are used to control the wafer temperature during a given process cycle. Because the wafer resides on the platen, by controlling the temperature of the platen, wafer temperature can be controlled. Accordingly, elaborate measures have been devised to address the various means available for controlling the temperature of the platen. Some of these prior art techniques are described in U.S. Pat. Nos. 3,501,356; 4,496,609; 3,669,812; 4,542,298; 4,628,991; 4,671,204; 4,457,359; 4,282,924; and 3,885,061. These patents teach a technique of cooling the wafer by circulating liquids, such as water. Either the cooling of the apparatus as a whole is provided by the circulating cooling water, or in more sophisticated systems, channels or passages are provided in the base of the chuck to directly cool the wafer chuck.

Another prior art device is described in U.S. Pat. No. 4,274,476, in which heat created inside the wafer is transferred to an expandable heat pipe, wherein the heat causes the fluid in the heat pipe to boil and vaporize. The vaporizable liquid is inside the cavity for expanding the heat pipe when heated and for transferring heat from one plate to the other. Furthermore, another scheme is described in U.S. Pat. No. 3,724,536, in which a fluid coolant, such as carbon dioxide, undergoes a rapid expansion upon entering an expansion chamber, thereby cooling the conductive element and consequently the device under control.

In practice, the temperature of the chuck must frequently be controlled at a temperature substantially below that of the wafer process temperature, especially when there is substantial energy input into the wafer. Substantial energy input to the wafer will usually occur when processing techniques such as plasma etch, chemical vapor depositions (CVD), and electron cyclotron resonance-chemical vapor deposition (ECR-CVD), just to name a few, are used. In some of these processes, the power input to the wafer can be as much as 8 $W/cm^2$. As an example, for a 6-inch wafer, this is equivalent to a total power input of nearly 1500 watts. To maintain the wafer at the desired process temperature requires this amount of heat energy be removed from the wafer during the process. Thus, a substantial difference in temperature ($\Delta T$) between the wafer and the chuck must be maintained in order to realize the required heat energy extraction from the wafer.

In a prior art system utilizing the circulation of cooling water, a considerable amount of cooling water flow must be maintained in order to dissipate the heat generated by such energy input. For example, an 1800 W energy input system would require approximately 0.5 liter/second (6.6 gallons/minute) flow of cooling water having a $\Delta T$ value of 1° C. from inlet to outlet. Thus, considerable amount of cooling water must be circulated in order to dissipate the required energy. Although it is possible to substitute other cooling fluids to reduce the required volume of flow of the coolant, significant amount of liquid is still needed and the liquid must be maintained in a closed system for recirculation. In many instances condensation or other processes for reclaiming the liquid is needed within the closed system.

Furthermore, with most prior art closed loop systems, fluid passages are typically present within the wafer chuck to circulate the cooling fluid in order to dissipate the heat from the chuck. Additionally, in a closed loop system, the temperature of the circulating fluid will typically need to be controlled. In some instances where an expansion chamber is used, such as in a system utilizing liquid gas which is expanded to remove the heat, a sophisticated closed loop system must be present in order to control the temperature of the chuck, as well as maintaining the proper flow of a specially designated coolant, other than water, to the wafer chuck.

In those special processes, such as plasma etch and ECR-CVD processes, additional temperature control problems are encountered. These processes deposit substantial amounts of energy into the wafer and the wafer must be cooled by the wafer chuck to keep it at the selected process temperature. For example, in one CVD-$SiO_2$ deposition process, the temperature of the chuck is controlled to a value in the range of 65° to 90° C. by circulating thermostated liquid through the base of the chuck. If a cold (room temperature) wafer is loaded onto the chuck, the wafer will be heated to the temperature of the chuck within a few seconds. The wafer temperature, however, is still 200° to 400° C. below the optimum deposition temperature. If the film deposition is begun before the wafer is at this temperature, the quality of the initial layer of the film will be inferior to that deposited at the optimum process temperature. Alternatively, with no silane flow into the reactor the plasma can be used to heat the wafer without deposition, but at the cost of an additional 15 to 20 seconds added to the process. For a 120 second process that represents an increase in process time of about 16% or a proportional decrease in yield in the number of wafers that can be processed per hour.

For maximum throughput of the tool in certain high energy processes, such as plasma processes, it is imperative that the wafer be brought up to its operating temperature as quickly as possible and once the operating temperature has been reached, to remove the process generated heat from the wafer in a controlled manner. In order to provide these objectives, it is preferred that a chuck be designed to accommodate the thermal shock of drastic temperature changes of the order of 200°

C./sec and yet maintain the ability to dissipate heat energy in order to control the temperature of the wafer. In such a design, it is preferable to design an economical, yet efficient system, to reach the desired objectives.

SUMMARY OF THE INVENTION

A wafer chuck which utilizes the latent heat of vaporization of water or other liquids to extract heat to cool the wafer is described. The chuck has a substantially flat upper surface for the placement of a semiconductor wafer, but the chuck is substantially hollow in the interior. At the lower portion of the chuck, spray mechanisms are positioned into the cavity for spraying liquid in the cavity. The nozzles spray a mist of liquid to the underside surface of the chuck having the wafer residing thereon. Upon contact the liquid vaporizes if the chuck temperature is greater than the boiling point of the liquid. Heat extraction from the wafer is enhanced by using the latent heat of vaporization of the liquid. The operating temperature of the chuck can be established by the selection of a liquid of suitable boiling point. A central exhaust opening is also provided at the lower portion of the chuck to remove vapor from the cavity. When water is used, the steam can be readily exhausted into the air. For other fluids, an external condenser can be used to recycle the fluid.

An insulated heater is provided on the upper surface of the chuck, disposed between the chuck and the wafer, in order to raise the temperature of the wafer to its operating range. Thus, the wafer can be rapidly brought up to its operating temperature, prior to the commencement of the wafer process cycle.

DETAILED DESCRIPTION OF THE PREFERRED EMBODIMENT

Figure 1:
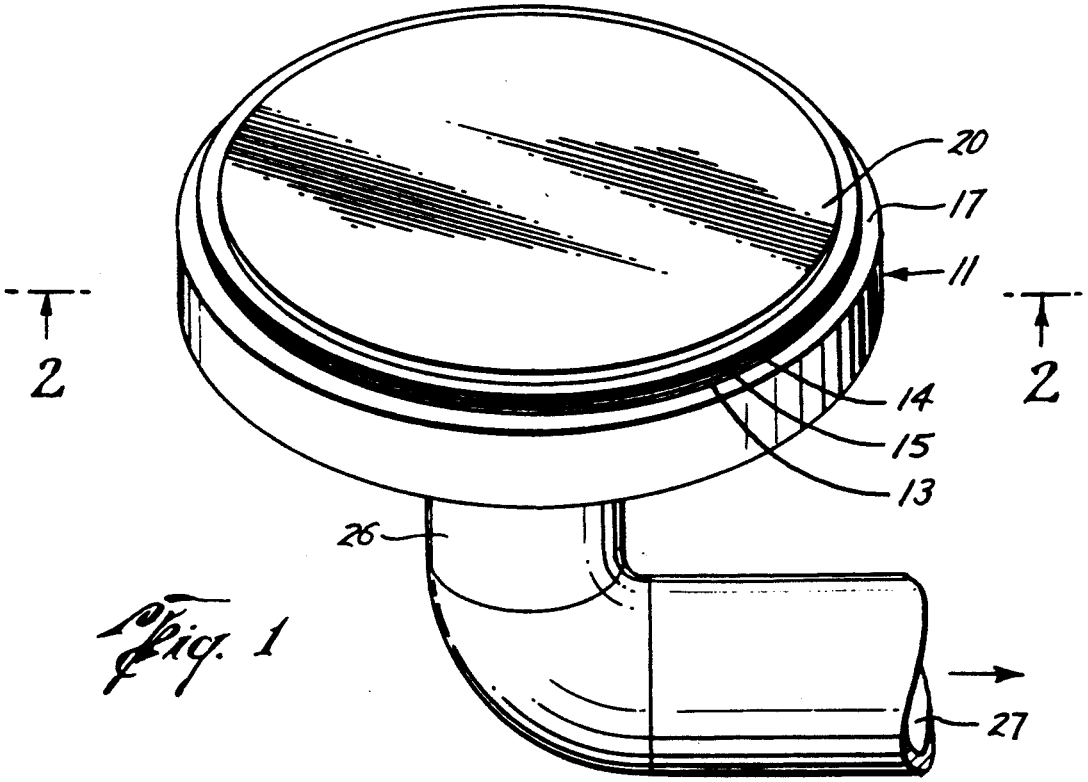
FIG. 1 is pictorial view of a wafer chuck of the present invention.

A wafer chuck for using the vaporization of water to remove excess heat energy from a semiconductor wafer is described. In the following description, numerous specific details are set forth, such as specific shapes, materials, etc., in order to provide a thorough understanding of the present invention. It will be obvious, however, to one skilled in the art that the present invention may be practiced without these specific details. In other instances, well-known techniques have not been described in detail in order not to unnecessarily obscure the present invention.

The present invention provides for a wafer chuck which is to be utilized in processing wafers in a temperature range of −150° to +500° C. It is especially designed for use with processes where substantial energy input to the wafer is encountered, such as during plasma etch, CVD and ECR-CVD depositions, but not necessarily limited to these. Although the present invention is described in reference to its use in a plasma environment, it is to be noted that the present invention can be used in non-plasma environment as well.

In a typical plasma process a given semiconductor wafer is loaded into a chamber and onto a chuck which is most likely at or near room temperature. Then some form of heating means will be required to raise the temperature of the wafer to the desired operating point if it is above room temperature. Conversely, if the desired operating point is below room temperature, then some form of cooling means, typically that provided by a lower boiling point liquid, will lower the temperature of the wafer below room temperature.

Usually, the operating point falls within a temperature range of −150° to +500° C. Some finite amount of time is required to change the wafer temperature from room temperature to the operating temperature. If, in a plasma system, plasma is used to heat the wafer to raise it to the operating temperature, a significant portion of the total process time may be devoted to changing (raising the temperature in this instance) the temperature of the wafer to the desired operating temperature. For process efficiency it is desirable to reach this operating temperature in the minimum amount of time possible, so that critical processing time is not utilized in the preparation stage, but instead is used in the actual plasma processing stage for etching or depositing. However, once the operating temperature has been reached, the temperature of the wafer will continue to rise unless the chuck is capable of dissipating the process generated heat in order to maintain the wafer at a controllable operating temperature. Thus, for an efficient plasma processing operation, the wafer is brought to the operating temperature as rapidly as possible by electrical heating. Once the operating temperature has been reached, the plasma process is switched on, the electrical heater is switched off and the liquid spray is started to provide cooling of the chuck in order to maintain the wafer at the desired operating temperature. When water is used as the cooling liquid, a cooling rate of greater than 200° C./sec can be realized.

The wafer chuck of the present invention provides for rapid cooling to quickly change the chuck temperature to maintain the wafer at the desired operating temperature when the plasma is switched on in a plasma etching or deposition reactor chamber. Optionally, the chuck of the present invention provides a means for heating the chuck and the wafer by introducing heat energy by the use of an electrical heater to bring the wafer quickly up to its operating temperature. In order to provide for the desired rapid heating and/or the rapid cooling of the chuck, the chuck must be capable of withstanding the severe thermal shock (temperature change per unit time) that the chuck will necessarily undergo during the cooling and heating cycles. The wafer chuck of the present invention provides for these requirements.

Figure 3:
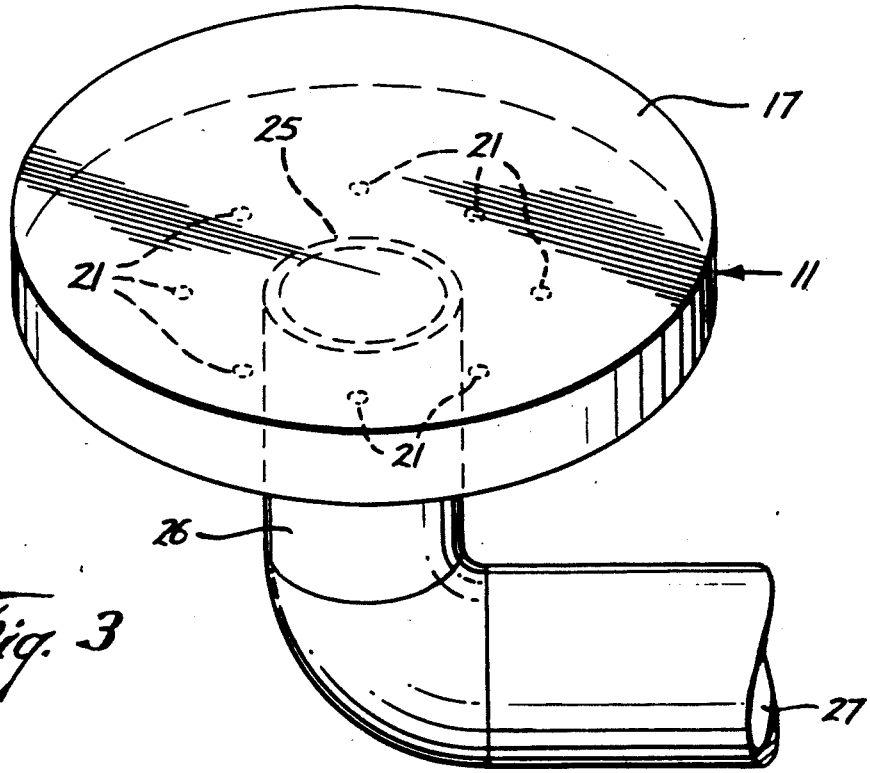
FIG. 3 is a drawing of the wafer chuck of the present invention, showing the placement of various inlet and exhaust openings.
Figure 2:
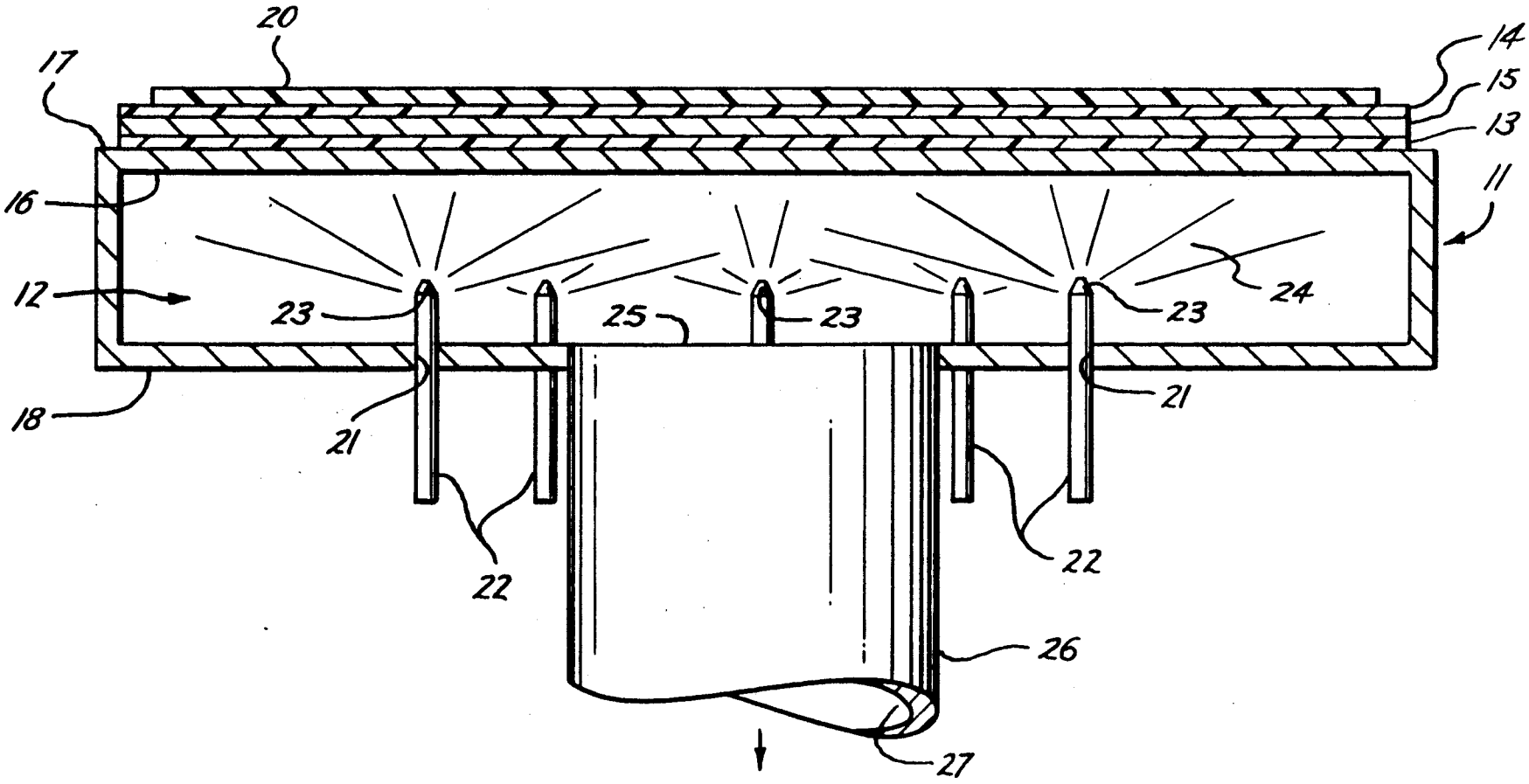
FIG. 2 is a cross-sectional view of the wafer chuck of FIG. 1.

Referring to FIGS. 1, 2, and 3, a wafer chuck 11 of the present invention is shown. Chuck 11 is a three-dimensional disk which is circular in shape and substantially flat on its upper surface to accommodate a typical circular semiconductor wafer 20. The interior of chuck 11 is substantially hollow, thereby forming a cavity 12 within. At the lower surface 18 of chuck 11, a plurality of inlet openings 21 are disposed at various predetermined locations. Also along the bottom surface 18 of chuck 11, an outlet opening 25 is located. In the preferred embodiment, outlet opening 25 is centrally disposed while inlet openings 21 are distributed concentrically and having equidistant separation. The actual number and position of the openings 21 are a design choice as long as the cooling constraints below are met. Furthermore, it is to be noted that although the present invention is described in terms of using water as the cooling liquid, various other liquids ca be readily used without departing from the spirit and scope of the present invention.

A liquid mist spray mechanism 22, such as a means having a jet or a spray nozzle 23, is inserted into each of the inlet openings 21. Nozzle (jet) 23 of each spray means 22 can reside within opening 21 without penetrating into cavity 12 or, alternatively, it can actually penetrate into and reside within the region of cavity 12, as is shown in FIG. 2. The actual height of the penetration of each nozzle 23 into cavity 12 (as well as the number and positioning of the nozzles) is a design choice, as long as the liquid mist spray from all nozzles 23 covers substantially all of the underside surface area 16 of chuck 11. The other end of each spray mechanism 22, which end is external to cavity 12, is coupled to a pressurized liquid source. The exhaust opening 25 is coupled to an exhaust pipe 26 which provides a passage for the exhaust gas to an exhaust opening 27.

In operation, the pressurized liquid causes each spray mechanism 22 to spray liquid in form of a mist to the underside 16 of chuck 11. If the chuck 11 is above the liquid temperature, the liquid will vaporize upon contact. The vaporization causes heat to be extracted from chuck 11. The cavity 12 provides for the expansion to take place when liquid is vaporized to gas. The gas is then exhausted through opening 27 without the use of forced exhaust and/or vacuum. In the preferred mode, water is expanded and exhausted as steam.

The actual number and placement of the spray mechanisms 22, is a design choice, as long as the spray 24 from nozzles 23 are capable of spraying all of the underside surface 16 of chuck 11. As shown in FIG. 3, the preferred embodiment has eight openings 21 disposed radially in a circular pattern about the center of chuck 11. Each of the nozzles 23 cover a certain predetermined area of the underlying surface 16, such that all of the eight nozzles 23 are capable of spraying, substantially all of the underlying surface 16 of chuck 11.

The chuck 11 of the preferred embodiment is constructed from stainless steel. The other associated elements 22, 23, and 26 are also constructed from stainless steel in order to have the same expansion properties as chuck 11. For operation below room temperature, aluminum alloys or copper can be used. Two factors affect the choice of materials for the body of the chuck. The material of the chuck must be compatible with the chosen fluid over the temperature range of operation. For example, aluminum and water may not be a compatible combination at higher temperatures. The second factor is the thermal expansion coefficient of the chuck material. The thermal expansion of the chuck materials must match closely the thermal expansion coefficient of the insulating materials bonded to the top of the chuck.

Overlying the upper surface of chuck are two insulating layers 13 and 14 having a heating layer 15 dispose there between. A wafer 20 is then positioned onto the upper insulating layer 14. The purpose of the insulating layers 13 and 14 is to provide insulation between the heater element 15 and the chuck 11, as well as the heater element 15 and wafer 20.

The purpose of the heater element 15 is to rapidly heat the wafer 20 to raise the temperature of the wafer from room temperature to the operating temperature as rapidly as possible prior to the turning on of plasma energy. The preferred embodiment uses electrical energy, wherein heater element 15 converts this electrical energy to heat energy. A variety of well-known materials can be readily used for element 15. Some of these are described below. The insulating layers 13 and 14 of the preferred embodiment are constructed from a cermet material. Cerment materials are used because of the property of readily transferring heat, while providing the necessary insulation of the electric heater element 15.

Some of the heater/cermet combinations are tungsten electrode embedded in a Ti-Alumina cermet, platinum with a Pt-Alumina cermet, or Nichrome (or Ni-Cr alloy) with Cr-Alumina cermet. A critical consideration is to match the coefficient of thermal expansion of the heater material and the associated cermet. A desirable feature of the heater material is to have a low temperature coefficient of resistance. It is to be noted that other combinations can be readily used.

When the process temperature is above room temperature, the present invention provides for the wafer 20 to be rapidly heated to the process operating temperature and once that temperature is reached, it provides for the extraction of excess heat energy when the plasma is turned on. In practice, the preferred embodiment is capable of heating the chuck 11 from room temperature to an operating temperature of 100° to 500° C. in a matter of seconds, due to the low thermal mass heater employed. Then, once the plasma is switched on, the present invention is capable of quickly lowering the chuck temperature by the use of latent heat of vaporization of liquid.

The cooling means takes advantage of the large latent heat of vaporization of the liquid applied as a mist (i.e., suspension of tiny liquid droplets). The quantity of liquid vaporized in g/s for a unit heat input per unit area (1 W/cm$^2$) is $$\frac{m}{t} = \frac{q}{h_v} \qquad \text{(Equation 1)}$$

where m is the mass of the liquid vaporized in grams, t is the time in seconds, q is the heat input per unit area per second (W/cm$^2$=J/s-cm$^2$), and $h_v$ is the heat of vaporization of the liquid in Joules/gram. The volume flow of liquid that is vaporized by the unit heat input per unit area is $$V_{liq} = \frac{m}{t} \times \frac{1}{\rho} \qquad \text{(Equation 2)}$$

where $\rho$ is the density of the liquid at 25° C. in g/cm$^3$. The volume of gas exhausted to the atmosphere (pressure=1 atm) at ambient temperature (T=25° C. or 298 K) is $$V_{gas} = \frac{m}{M} \times 0.082T \times 60 \qquad \text{(Equation 3)}$$

where M is the molecular weight in g/mol, 0.082 is the gas constant in liter-atm/mol-K, T is the temperature in K, and 60 converts the flow rate tk standard liters per minute (SLM). As an example, four liquids of different boiling points that might be used as the liquid for the wafer chuck of the present invention is provided in Table 1 below. The last two columns of Table 1 give the volumes of gas for two different heat inputs of 1 W/cm$^2$ and 8 W/cm$^2$ for a 150-mm-diameter wafer.

TABLE 1

| Liquid | Boiling Point (°C.) | Heat of Vaporization (J/g) | Volume of Liquid for 1 W/cm$^2$ (cm$^3$) | Volume of Gas for 1 W/cm$^2$ (SLM) | V (gas SLM) for 150-mm Wafer @ 1 W/cm$^2$ | V (gas SLM) for 150-mm Wafer @ 8 W/cm$^2$ |
|---|---|---|---|---|---|---|
| Nitrogen | −196 | 199 | 6.2 E-03 | 2.6 E-01 | 47.9 | 383.1 |
| Freon TM -R-22 | −40 | 232 | 3.6 E-03 | 7.3 E-02 | 13.3 | 106.4 |
| Water | 100 | 2260 | 4.4 E-04 | 3.6 E-02 | 6.5 | 52.5 |
| Ethylene glycol | 197 | 800 | 1.1 E-03 | 2.9 E-02 | 5.4 | 3.0 |

Since, for water $$h_v = 2260 \text{ j/gm} \quad \text{(Equation 4)}$$

with a heat energy input ($q_{in}$) of 8 w/cm$^2$ into a 150 mm diameter wafer is:

$$q_{in} = 1413.7 \text{ watts (j/s)} \quad \text{(Equation 5)}$$

This will be balanced by the heat extracted ($q_{out}$) by the vaporizing the water, which is defined by:

$$q_{in} - q_{out} = 0 \quad \text{(Equation 6)}$$

and $$q_{out} = h_v \frac{m}{t} \quad \text{(Equation 7)}$$

To extract this quantity of heat will require:

$$\frac{m}{t} = \frac{q_{out}}{h_v} \quad \text{(Equation 8)}$$

In calculation m/t=0.626 gm/s, signifying the amount of water required to extract heat. Since the density of water $\rho$ is 1 gm/cm$^3$, the volume of liquid water evaporated and, therefore, which must be supplied is $(m/t)/\rho = 0.627$ cm$^3$/s.

For a 120 second plasma process, the volume of water required to maintain the chuck temperature at 100° C. is 75.3 cm$^3$.

The volume of gas (steam) that will be generated by the vaporization of 75.3 cm$^3$ of water can be readily calculated. The number of moles of vaporized liquid is:

$$0.626 \text{ gm}/18 \text{ gm/mol} = 3.48 \times 10^{-2} \text{ mols/s} \quad \text{(Equation 9)}$$

Using the perfect gas law $$V = \frac{nRT}{P} \quad \text{(Equation 10)}$$

where R=0.082 liter-atm/mole-K,

T=373.15K (100° C.), and P=1 atm, so that V=849 std. cm$^3$/s, which is approximately 51 standard liters/min.

By the application of the above formulated steps, the amount of liquid input, as well as the resultant gas exhaust, can be readily calculated for various temperature differences. The particular examples above are for cooling the chuck to various temperatures from −150° C. to 197° C. Further, the specific example illustrated in Equations 4–10 apply to the use of water as the cooling liquid and similar calculations apply if other liquids are used.

It is to be noted that when water is used, the exhaust gas is steam. That is, ordinary water (preferably distilled water) is sprayed to the underside of the wafer chuck to cool the chuck temperature. It is the latent heat of vaporization of water which provides the rapid cooling. For certain liquids, such as water or nitrogen, no specialized reclamation process and/or system is needed (although one can be utilized) and the converted gas can be readily exhausted to the atmosphere. Thus, a closed loop system need not be required.

However, with certain liquids, recovery may or will be necessary. For example, because of the expense and possible environmental problems with exhausting Freons TM or ethylene glycol to the atmosphere, a recovery condenser and recycling system will prove most practical. Although specific examples are detailed in Table 1, other liquids can be used to practice the present invention. Water is particularly desirable because of its large heat of vaporization, it is inexpensive and it is environmentally acceptable to exhaust to the atmosphere as steam.

Further, it is to be appreciated that a variety of heating and insulating elements can be used for the elements 13–15 of the present invention for heating the chuck to rapidly raise the temperature of the wafer to its process operating temperature. Due to properties exhibiting good thermal shock resistance, as well as good electrical resistance, cermet materials are recommended.

Thus, a rapid temperature response wafer chuck is described.

I claim:

1. An apparatus for cooling a semiconductor wafer disposed thereon comprising:

a body for having said semiconductor wafer reside thereon and said body having a hollow cavity therein;

spray means coupled to said body and disposed within said cavity for spraying a liquid to at least a portion of an interior surface of said cavity which is proximal to said semiconductor wafer, but wherein said liquid is prevented from physically contacting said wafer;

said liquid for extracting heat from said wafer by the use of latent heat of vaporization of said liquid when said liquid is sprayed onto said portion of said interior surface of said cavity and is vaporized upon contact with said interior surface of said cavity, such that said wafer is maintained at a predetermined temperature;

exhaust means coupled to said cavity of said body for exhausting vaporized liquid from said cavity.

2. The apparatus of claim 1 further including heating means coupled to a surface of said body upon which said semiconductor wafer resides, wherein said semiconductor wafer is disposed onto said heating means and said heating means is utilized to rapidly heat said semiconductor wafer to a predetermined temperature.

3. The apparatus of claim 1 wherein said apparatus utilizes wafer as said liquid.

4. The apparatus of claim 1 wherein said apparatus utilizes liquid nitrogen as said liquid.

5. A chuck for cooling a semiconductor wafer disposed thereon during processing of said wafer comprising:

a body having a substantially flat upper surface for having said semiconductor wafer reside thereon and said body having a hollow cavity therein;

a plurality of spray nozzles coupled to said cavity of said chuck for spraying water to at least a portion of an interior surface of said cavity, including the underside of said flat upper surface, but wherein said water is prevented from physically contacting said wafer;

said water for extracting heat from said wafer by use of the latent heat of vaporization of said water when said water is sprayed onto said interior surface and is vaporized upon contact with said interior surface of said cavity, such that said wafer is maintained at a predetermined temperature;

said cavity having an exhaust opening for exhausting steam from said cavity to an atmospheric ambient.

6. The chuck of claim 5 wherein said body is fabricated from stainless steel.

7. The chuck of claim 5 further including a heater coupled to said upper surface of said body wherein said semiconductor wafer is disposed onto said heater and said heater is utilized to heat said semiconductor wafer.

8. The chuck of claim 7 wherein said body is fabricated from stainless steel.

9. A chuck for cooling a semiconductor wafer disposed thereon during plasma processing of said wafer comprising:

a body having a substantially flat upper surface and a hollow cavity disposed therein;

a heater having a substantially flat shape coupled to said upper surface of said body, wherein said semiconductor wafer resides thereon;

a plurality of spray jets coupled to said cavity of said chuck for spraying water to at least a portion of an interior surface of said cavity, including the underside of said flat upper surface, but wherein said water is retained in said cavity and isolated from said semiconductor wafer;

said water for extracting heat from said water by the use of latent heat of vaporization of said water when said water is sprayed onto said interior surface and is vaporized upon contact with said interior surface of said cavity, such that said wafer is maintained at a predetermined temperature;

said cavity having an exhaust opening for exhausting steam from said cavity to an atmospheric ambient.

10. The chuck of claim 9 wherein said body is fabricated from stainless steel.

11. The chuck of claim 10 wherein said heater is comprised of an electric heating element disposed between a dielectric material.

12. The chuck of claim 11 wherein said dielectric material is a cermet material.

* * * * *